(12) United States Patent
Versen et al.

(10) Patent No.: US 7,405,986 B2
(45) Date of Patent: Jul. 29, 2008

(54) REDUNDANT WORDLINE DEACTIVATION SCHEME

(75) Inventors: Martin Versen, Feldkirchen-Westerham (DE); Peter Thwaite, Burlington, VT (US)

(73) Assignee: Infineon Technologies AG, Munich (DE)

( * ) Notice: Subject to any disclaimer, the term of this patent is extended or adjusted under 35 U.S.C. 154(b) by 75 days.

(21) Appl. No.: 11/240,981

(22) Filed: Sep. 29, 2005

(65) Prior Publication Data

US 2007/0070745 A1    Mar. 29, 2007

(51) Int. Cl.
*G11C 7/00* (2006.01)

(52) U.S. Cl. ............. 365/203; 365/185.09; 365/185.23; 365/185.25

(58) Field of Classification Search ................ 365/201, 365/226, 203, 204, 185.09, 185.23, 185.25
See application file for complete search history.

(56) References Cited

U.S. PATENT DOCUMENTS

| | | | | |
|---|---|---|---|---|
| 5,276,360 A * | 1/1994 | Fujima | ......................... | 326/10 |
| 5,315,551 A * | 5/1994 | Hirayama | .................... | 365/200 |
| 5,555,212 A * | 9/1996 | Toshiaki et al. | ............. | 365/200 |
| 5,568,433 A * | 10/1996 | Kumar | ........................ | 365/200 |
| 5,689,469 A * | 11/1997 | Asaka et al. | ................. | 365/203 |
| 5,963,489 A * | 10/1999 | Kirihata et al. | ............. | 365/200 |
| 6,219,286 B1 * | 4/2001 | Fuchigami et al. | .......... | 365/200 |
| 6,831,869 B2 * | 12/2004 | Yamano | ...................... | 365/200 |

* cited by examiner

*Primary Examiner*—Pho M. Luu
(74) *Attorney, Agent, or Firm*—Patterson & Sheridan, L.L.P.

(57) ABSTRACT

A method and apparatus for reducing power consumption of a memory device. The method includes initiating a precharge operation. The precharge operation includes driving one or more bitlines to a precharge voltage. The method also includes identifying one or more defective wordlines and, during the precharge operation, driving the identified defective word lines to the precharge voltage.

32 Claims, 6 Drawing Sheets

REDUNDANT WORDLINE DEACTIVATION SCHEME

BACKGROUND OF THE INVENTION

1. Field of the Invention

The invention generally relates to reducing the power consumption of memory devices. More specifically, the invention relates to reducing the power consumption of memory devices due to defects in the memory device.

2. Description of the Related Art

Many modern electronic devices contain digital memory (e.g., a dynamic random access memory, DRAM). Each memory may be used to store information for a digital device. Users of such electronic devices typically desire large amounts of memory in a small package. Where the electronic devices are portable (e.g., battery powered), users may also desire electronic devices which do not consume as much power and therefore have a longer battery life. Thus, manufacturers of electronic devices typically desire small, high density memories with low power consumption.

To meet the demand for small, high density memories, memory manufacturers typically create memory chips with the smallest available features (e.g., transistors and control lines) and with densely packed memory cells. However, as the size of features in a memory chip shrinks and as the memory density of a memory chip increases, small, uncontrollable errors in the manufacturing process may cause more defective memories at a high cost to the manufacturer.

An example of a possible defect in a memory device is a short (e.g., an unintended electrical connection) between a defective wordline and a bitline of a memory device. Wordlines and bitlines are lines in a memory device which are used to access a memory cell (e.g., at the junction of the wordline and bitline) in the memory device. Where a wordline and bitline are shorted, the memory cell located at the junction of the wordline and bitline may, in some cases, not be accessible, thereby resulting in a defective wordline and defective memory device.

To reduce the number of defective memory devices resulting from defective wordlines and/or bitlines, many manufacturers create memory devices with redundant wordlines and/or bitlines. Where, for example, the manufacturer detects a defective wordline, the memory device may use a redundant wordline instead of the defective wordline. When a memory device uses a redundant wordline instead of a defective wordline, the defective wordline may be referred to as a repaired wordline.

While repairing a defective wordline may prevent a memory device from losing data, the defective wordline may still remain shorted to a bitline. In some cases, where a defective wordline is shorted to a bitline, current may flow between the defective wordline and the bitline, thereby increasing the power consumption of the memory device.

As an example, when wordlines and bitlines are not being used to access memory cells, each wordline is deactivated and the bitlines are precharged in preparation for the next sensing operation. During deactivation, each wordline voltage may be lowered to a low voltage (e.g., the low wordline voltage, $V_{NWLL}$), thereby disconnecting each memory cell from the bitlines used to access the memory cell. The voltage of the bitlines when properly precharged is a voltage midway between the voltage corresponding to a bitline high logic level ($V_{BLH}$) and the voltage corresponding to a bitline low logic level ($V_{BLL}$). The midway voltage (($V_{BLH}$+$V_{BLL}$)/2) may be referred to as the precharge voltage or bitline equalize voltage, $V_{BLEQ}$.

However, where a wordline is defective (e.g., shorted to a bitline), during precharge, current may flow from the bitline being held at the precharge voltage ($V_{BLEQ}$) to the defective wordline being held at the low wordline voltage ($V_{NWLL}$). Where current flows between a defective wordline and a bitline, the power consumption of the memory device may increase. In some cases, because each defective wordline may be in a precharge state for an extended period of time (e.g., when the memory device is not being accessed but is in a standby state), and because each memory device may contain several defective wordlines, the power consumption of the memory device during precharging due to defective wordlines may be substantial, thereby decreasing the value of the memory device (e.g., by reducing the battery life of electronic devices which use the memory device).

Accordingly, what is needed are methods and apparatuses for reducing the power consumption of a memory device due to a defective wordline.

SUMMARY OF THE INVENTION

Embodiments of the present inventions generally provide a method and apparatus for reducing power consumption of a memory device. In one embodiment, the method includes initiating a precharge operation. The precharge operation includes driving one or more bitlines to a precharge voltage. The method also includes identifying one or more defective wordlines and, during the precharge operation, driving the identified defective wordlines to the precharge voltage.

One embodiment provides a memory device including one or more bitlines, one or more defective wordlines, and circuitry. The circuitry is configured to initiate a precharge operation, wherein the precharge operation comprises driving the one or more bitlines to a precharge voltage, identify one or more defective wordlines, and, during the precharge operation, drive the identified defective wordlines to the precharge voltage.

One embodiment provides a memory device including one or more bitlines, one or more defective wordlines, and means for controlling. The means for controlling is configured to initiate a precharge operation, wherein the precharge operation comprises driving the one or more bitlines to a precharge voltage, identify one or more defective wordlines, and during the precharge operation, drive the identified defective wordlines to the precharge voltage.

One embodiment provides a memory device including one or more bitlines, one or more defective wordlines, and means for controlling. The means for controlling is configured to initiate a precharge operation, wherein the precharge operation comprises driving the one or more bitlines to a precharge voltage, identify one or more defective wordlines, and during the precharge operation, electrically isolate the identified defective wordlines.

One embodiment of the invention provides a method for reducing power consumption of a memory device. The method includes detecting one or more defective wordlines in the memory device and storing address information identifying each of the one or more defective wordlines. The method also includes initiating a precharge operation, wherein the precharge operation comprises driving one or more bitlines to a precharge voltage, and during the precharge operation, identifying the one or more defective wordlines using the stored address information and driving the identified one or more defective wordlines to the precharge voltage.

One embodiment of the invention provides a memory device comprising a plurality of normal wordlines, one or more redundant wordlines, repair circuitry, precharge circuitry, bitline control circuitry, and repaired wordline deactivation circuitry. The one or more redundant wordlines are used to replace one or more defective normal wordlines. The repair circuitry is configured to store information identifying the one or more defective normal wordlines and the one or more redundant wordlines used to replace the one or more defective normal wordlines. The precharge circuitry is configured to initiate a precharge operation and the bitline control circuitry is configured to drive one or more bitlines to a precharge voltage during the precharge operation. The repaired wordline deactivation circuitry is configured to identify the one or more defective wordlines using the stored information and, during the precharge operation, drive the identified one or more defective wordlines to the precharge voltage.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide a method and memory device for reducing power consumption in the memory device during precharge due to a defective wordline. In one embodiment, during precharge, the voltage for the defective wordline may be driven to a precharge voltage. The precharge voltage may also be applied to bitlines in the memory device. By applying the precharge voltage to the defective wordline and the bitlines, a leakage current (e.g., due to a short) between the defective wordline and bitlines may be reduced, thereby reducing the power consumption of the memory device during precharge.

While described below with respect to wordlines in a memory bank of a memory device, embodiments of the invention may be used in a memory device containing multiple memory banks. Embodiments may be utilized in memory devices with a segmented wordline architecture (e.g., where a main wordline is used to access a local wordline, also referred to as a hierarchical wordline architecture). Embodiments may also be utilized in memory devices with a stitched wordline architecture, for example, where a polysilicon wordline is electrically connected at multiple points ("stitched") by stitches (electrical connections, sometimes referred to as straps) to a layer of low resistance metal.

Signal name used below are exemplary names, indicative of signal levels used to perform various functions in a given memory device. In some cases, the relative level of such signals may vary from device to device. Furthermore, the circuits and devices described below and depicted in the figures are merely exemplary of embodiments of the invention. As recognized by those of ordinary skill in the art, embodiments of the invention may be utilized with any memory device containing defective wordlines.

An Exemplary Memory Device

Figure 1:
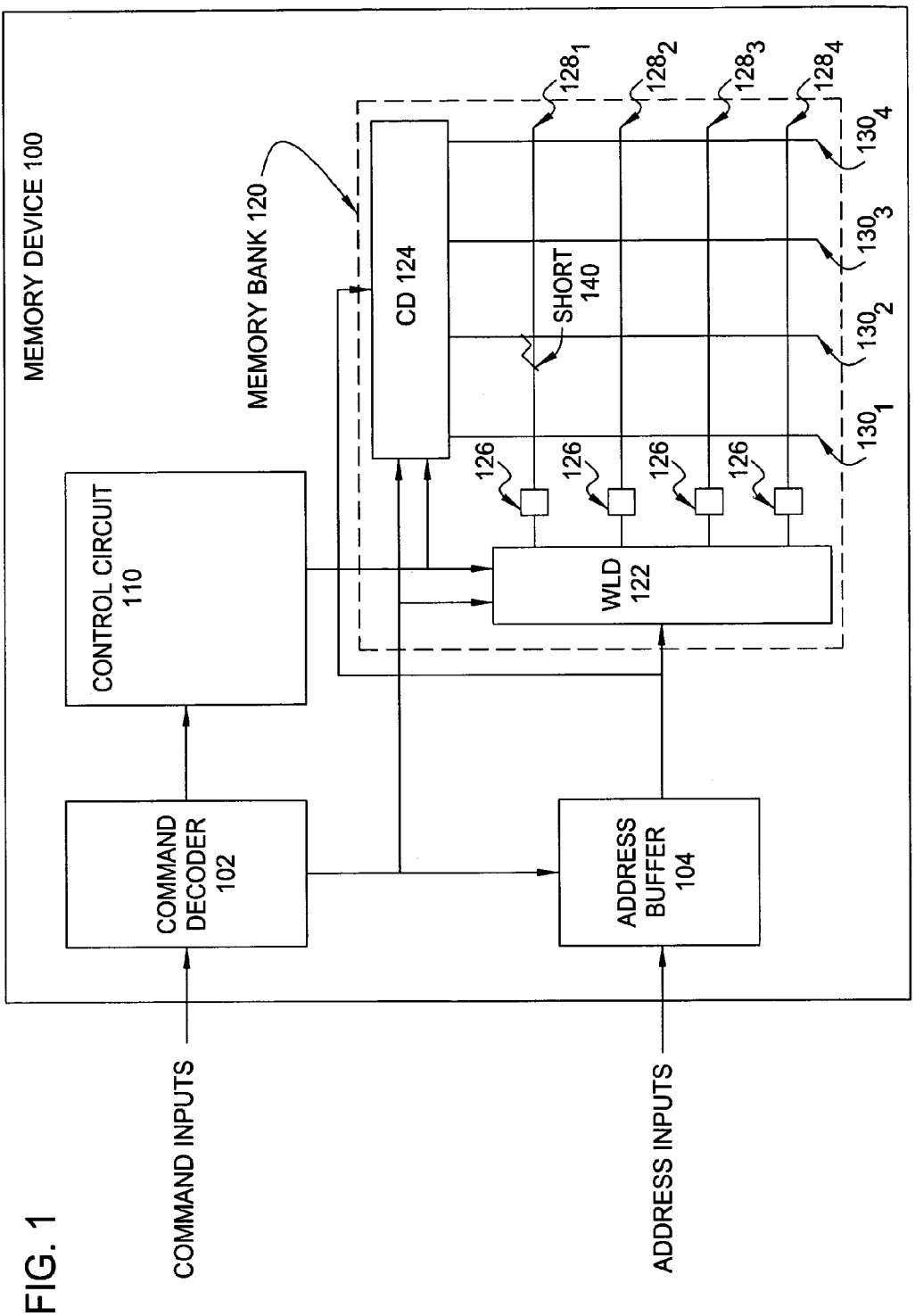
FIG. 1 is a block diagram depicting a memory device according to one embodiment of the invention.

FIG. 1 is a block diagram depicting a memory device 100 according to one embodiment of the invention. The memory device 100 may include address inputs and command inputs. The address inputs may be received by an address buffer 104 and the command inputs may be receive by a command decoder 102. The address inputs may be used by a wordline decoder 122 and column decoder 124 to access memory cells in a memory bank 120. In some cases, multiple memory banks 120 may be accessed using a single wordline decoder 122 and column decoder 124.

In one embodiment, the column decoder 120 may select bitlines 130 of the memory bank 120 to be accessed. Similarly, the wordline decoder 126 may select wordlines 128 to be accessed. In some cases, access may occur based on an address received by the memory device 100 from an external source. Optionally, the access may occur based on an address which is internally generated. Other circuitry such as sense amps, output buffers, data strobe circuits, etc. (not depicted) may also be used to access and output data from the memory bank 120.

The memory bank 120 typically contains a plurality of memory cells. Each memory cell may be located at the intersection of a wordline 128 and a bitline and may be used to store a bit of information for the memory device 100. In some cases, when a given row of memory cells in the memory bank 120 is accessed (e.g., by a read, write, or refresh), a wordline 128 in the memory bank 120 corresponding to a given address may be activated. In some cases, the activation may be initiated by an explicit command (ACT) issued to the memory device 100. After the wordline 128 has been activated and the memory cells have been accessed, bitlines in the memory bank 120 may be precharged. In some cases, the precharge may also be initiated by an explicit command (PRE) issued to the memory device 100. Activating and precharging are described in greater detail below.

When a memory address is activated, the wordline driver 126 for a wordline 128 corresponding to the accessed address may drive the wordline 128 to a high voltage (referred to as the wordline on voltage, $V_{WLON}$). When the wordline 128 is driven to $V_{WLON}$, one or more access transistors located at the intersection of the wordline 128 and a bitline 130 may be activated (e.g., turned on), thereby allowing memory cells located at the intersection of the wordlines 128 and bitlines 130 to be accessed.

In one embodiment, after a wordline in the memory bank 120 has been activated, bitlines 128 in the memory bank 120 may be precharged. When the precharge is initiated, each wordline 128 in the memory bank 120 may be lowered to the low wordline voltage $V_{NWLL}$, thereby electrically disconnecting the bitlines 130 from the memory cells in the memory bank 120. As described above, when the bitlines 130 are disconnected from the memory cells, the bitlines 130 may be driven to a voltage ($V_{BLEQ}$) which is midway between the voltage corresponding to a bitline high logic level ($V_{BLH}$) and the voltage corresponding to a bitline low logic level ($V_{BLL}$), such as ($V_{BLH}+V_{BLL}$)/2). By precharging the bitlines 130 to $V_{BLEQ}$, during a subsequent operation when the values stored in the memory cells are sensed using the bitlines 130, a smaller voltage swing may be necessary to drive the bitlines 130 to the voltage corresponding to the stored logic value (e.g., $V_{BLH}$ for a stored high logic level or $V_{BLL}$ for a stored low logic level) and thereby sense the value stored in the memory cells. $V_{BLEQ}$ may also be intermediate (or approximately intermediate) between the wordline off voltage $V_{WLON}$ and the wordline off voltage $V_{NWLL}$.

As mentioned above, in some cases, the memory device 100 may have a defect such as, for example, a short 140 between a wordline 128₁ and bitline 130₂. To prevent such a defect from rendering a memory device 100 defective, the memory device 100 may contain circuitry used to repair defective wordlines.

Figure 2:
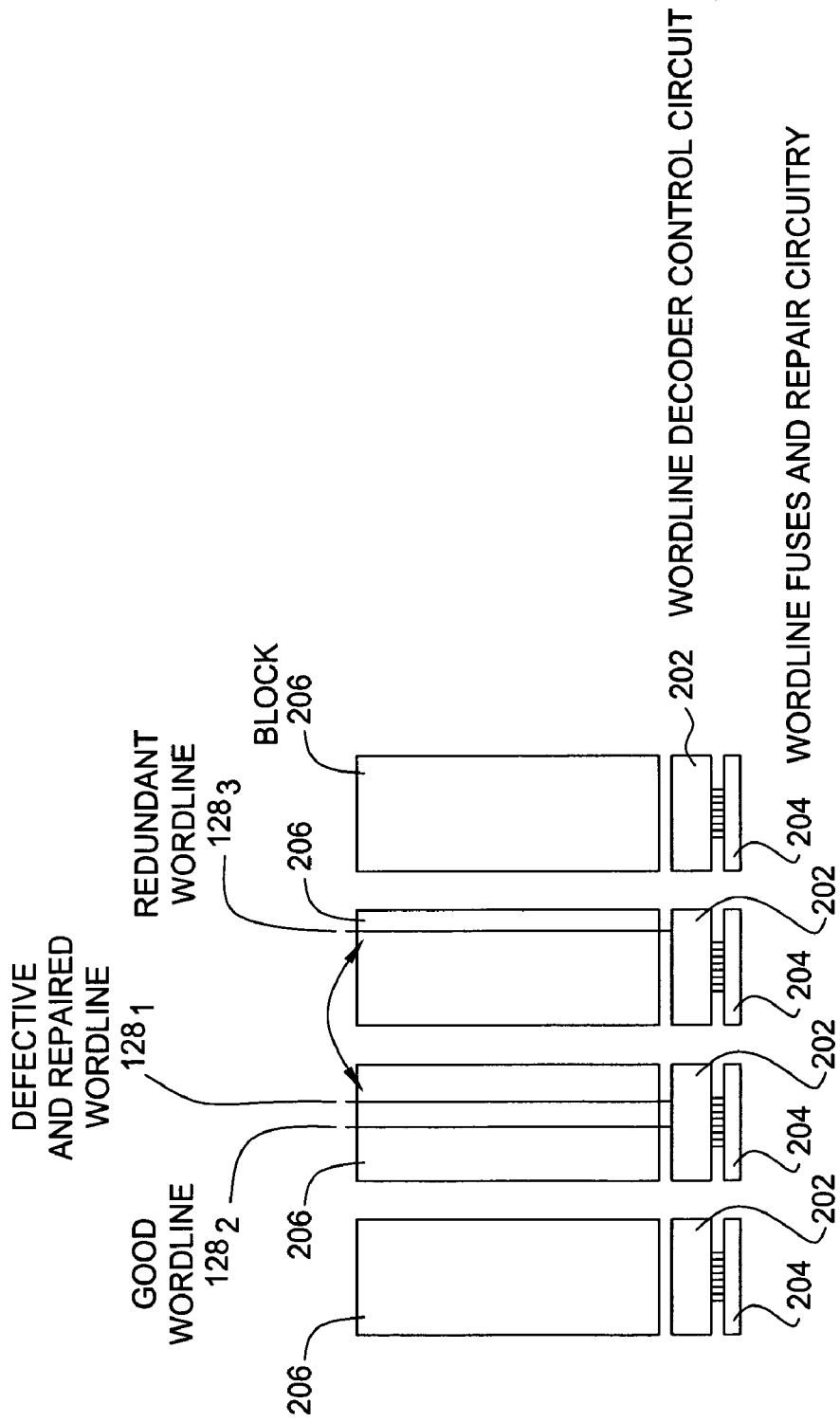
FIG. 2 is a block diagram depicting elements of a memory bank according to one embodiment of the invention.

FIG. 2 is a block diagram depicting circuitry used to repair a defective wordline according to one embodiment of the invention. In one embodiment, each memory bank 120 may be divided into separate blocks 206 with each block 206 containing a plurality of wordlines 128. In some cases, the wordlines 128 in each block 206 may be accessed using a wordline decoder control circuit 202. For example, the wordline decoder control circuit 202 may receive address data from the address buffer 104 and control information from the control circuit 110 which may be used to access the appropriate wordline.

In one embodiment of the invention, a defective wordline $128_j$ in a block 206 may be detected by testing the memory device 100. For example, a series of data values may be written to each address in the memory device 100 and then read from the memory device. A defective wordline 128₁ may be detected where the data read from memory device 100 fail to match the data values written. Testing methods are described below in greater detail.

As stated above, to prevent a defective wordline 128₁ from rendering a memory device 100 defective, the memory device 100 may contain circuitry used to replace the defective wordline 128₁ with another wordline (e.g., wordline 128₃) in the memory device 100. A wordline used to replace a defective wordline 128₁ may be referred to as a redundant wordline 128₃. Other wordlines which are not defective and are redundant wordlines (e.g., wordline 128₂) may be referred to as good wordlines.

When a defective wordline 128₁ is detected, fuses and repair circuitry 204 may be used to replace the defective wordline 128₁ with a redundant wordline 128₃. For example, the fuses and repair circuitry 204 may record one or more addresses of the defective wordlines 128₁, for example, by electronically programming one or more fuses. The fuses and repair circuitry 204 may also be used to record the location of one or more redundant wordlines 128₃ to be used instead of the defective wordline(s) 128₁.

After the fuses and repair circuitry 204 have been programmed accordingly, the fuses and repair circuitry 204 may be used to detect an attempt to access the defective wordline 128₁. For example, when the memory device 100 is powered on, the recorded address may be read from the fuses and repair circuitry 204 by the wordline control circuit 202 and/or other control circuits in the wordline decoder 122. When the wordline decoder 122 receives a request to access a given address, the wordline decoder 122 may compare the requested address to one or more recorded addresses which correspond to defective wordlines 128₁.

If the wordline decoder 122 detects an access to the recorded address corresponding to the defective wordline 128₁, the redundant wordline 128₃ may be accessed instead. For example, the redundant wordline 128₃ may be driven to a wordline on voltage ($V_{WLON}$) while any and all defective wordlines (e.g., wordline 128₁) in a given block 126 may be driven to the wordline off voltage $V_{NWLL}$, thereby accessing memory cells controlled by the redundant wordline 128₃ instead of the defective wordline 128₁. By driving any and all defective wordlines in a given block 126 to the wordline off voltage $V_{NWLL}$, additional capacitance that would be connected to the bitlines 130 (e.g., due to memory cells accessed by the defective wordlines) may be reduced (e.g., by disabling the access transistors for those memory cells), thereby increasing the signal margin for bitlines 130 in the block 126. Also, by accessing the redundant wordline 128₃ instead of the defective wordline 128₁, the memory device may properly access data located at the recorded address. Where a defective wordline 128₁ is properly replaced by a redundant wordline 128₃, the defective wordline 128₁ may also be referred to as a repaired wordline 128₁ (or a defective and repaired wordline 128₁).

Thus, the defective wordline 128₁ may be repaired and the redundant wordline 128₃ may be used instead of the repaired wordline 128₁, thereby preventing the memory device 100 from being defective. However, as described above, during precharge, current may flow from the repaired wordline 128₁, which is held at $V_{NWLL}$ to the bitline 130₂, which is held at $V_{BLEQ}$, through short 140, thereby consuming power.

Limiting Power Consumption by a Repaired Wordline

According to one embodiment of the invention, power consumption in a defective and repaired wordline may be reduced or eliminated by using circuitry to change the repaired wordline voltage to $V_{BLEQ}$ during precharge. In one embodiment of the invention, circuitry (referred to as repaired wordline deactivation control circuitry) may be used to identify the repaired wordline 128₁ and change the repaired wordline voltage to $V_{BLEQ}$ during precharge.

Figure 3:
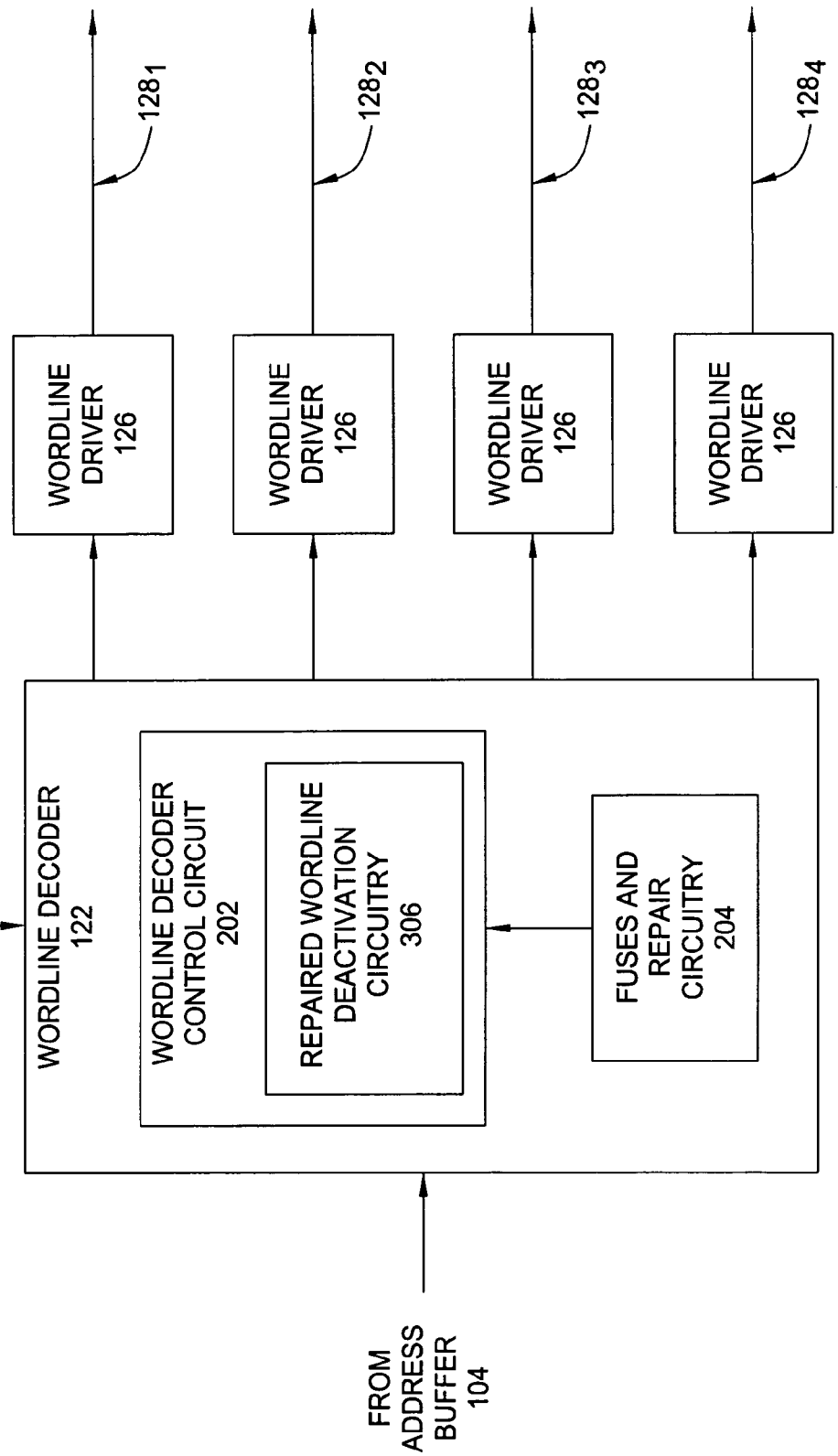
FIG. 3 is a block diagram depicting a wordline decoder circuit according to one embodiment of the invention.
Figure 4:
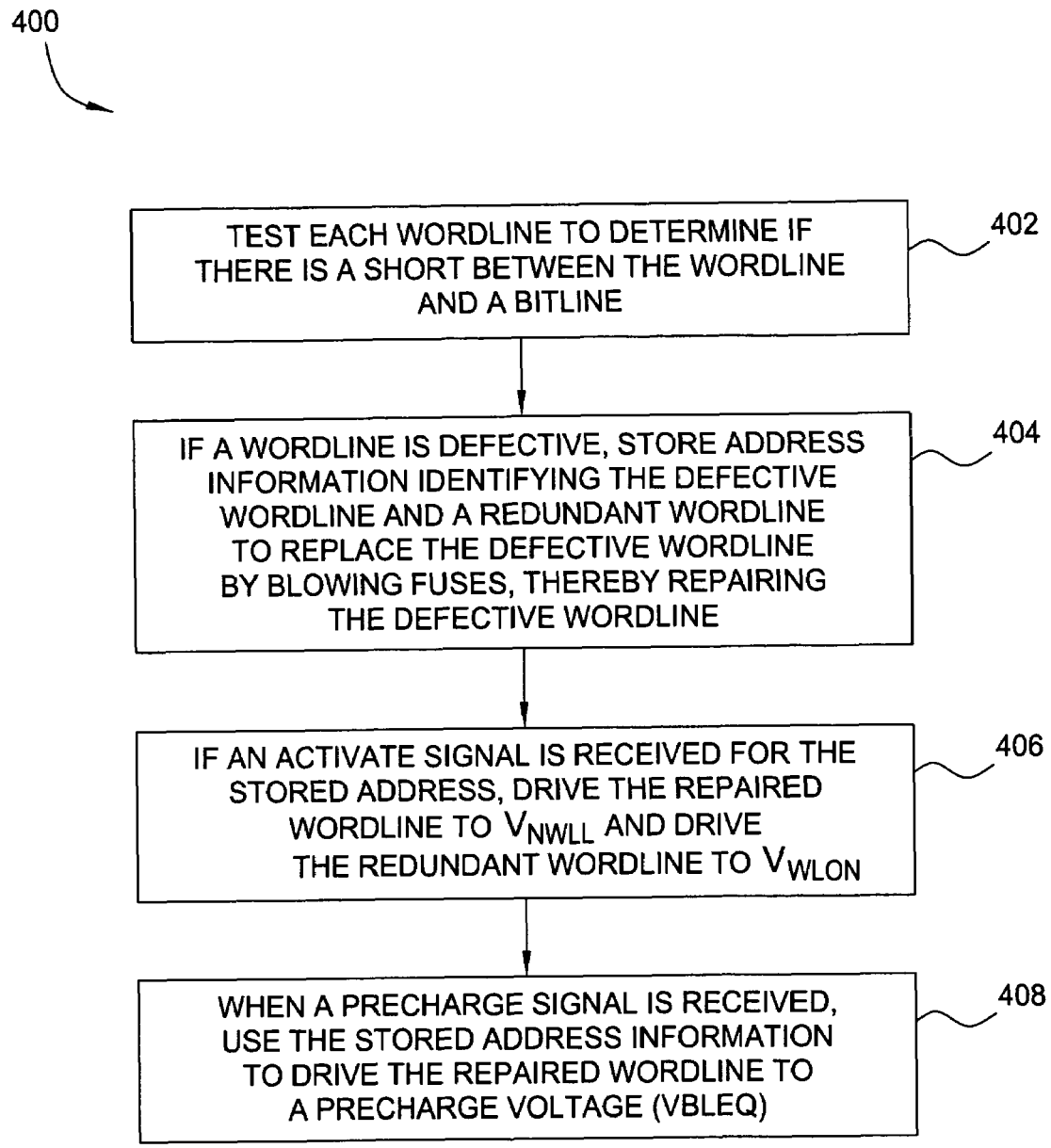
FIG. 4 is a flow diagram depicting a process for reducing the power consumption of a memory device due to a defective wordline according to one embodiment of the invention.

FIG. 3 is a block diagram depicting a wordline decoder circuit 122 with repaired wordline deactivation control circuitry 306 according to one embodiment of the invention. Components in FIG. 3 may be described with reference to FIG. 4, which illustrates operations 400 for reducing the power consumption of a memory device due to a defective wordline according to one embodiment of the invention. In other words, components illustrated in FIG. 3 may be configured to perform operations 400 (e.g., independently or collectively)

The process 400 may begin at step 402 where each wordline 128 in the memory device 100 is tested to determine if there is a short between the wordline 128 and a bitline 130. As described above, wordlines in the memory device may be tested by writing data to the memory device and reading data from the memory device.

At step 404, if a wordline (e.g., wordline 128₁) is defective, address information identifying the defective wordline and a redundant wordline (e.g., wordline 128₃) to replace the defective wordline may be stored, for example, by blowing one or more fuses, for example, in the fuses and repair circuitry 204. In some cases, the fuses may be electronically programmable fuses. Optionally, the fuses may be laser cut fuses or the address information may be stored in nonvolatile memory, such as, for example, a flash memory.

At step 406, if an activate signal is received indicating that the wordline located at the stored address is being activated, the repaired wordline may be driven to the low wordline voltage $V_{NWLL}$ and the redundant wordline may be driven to the wordline on voltage $V_{WLON}$. In one embodiment, the wordline decoder control circuit 202 may use the information stored in the fuses and repair circuitry 204 to determine when the stored address is being accessed and to determine which wordline to activate. Thus, as described above, information located at the stored address may be successfully accessed by using the redundant wordline $128_3$ instead of the repaired wordline $128_1$.

Then, at step 408, when a precharge signal is received, for example, indicating that the memory bank 120 (or multiple memory banks) containing the defective wordline is being precharged, the stored address information may be used, for example, by the repaired wordline deactivation circuitry 306, to drive the repaired wordline $128_1$ to the precharge voltage, $V_{BLEQ}$. As described above, by driving the repaired wordline voltage to $V_{BLEQ}$, the repaired wordline $128_1$ and the bitline $130_2$ to which the repaired wordline $128_1$ is shorted may have voltage levels which are equal or approximately equal. Because the voltage levels are equal or approximately equal, there may be no voltage difference between the repaired wordline $128_1$ and the bitline $130_2$, and therefore no current between the repaired wordline $128_1$ and the bitline $130_2$. Thus, a leakage current from the repaired wordline $128_1$ to a bitline $130_2$ may be reduced or eliminated, thereby reducing power consumption of the memory device 100 during precharge.

Figure 5:
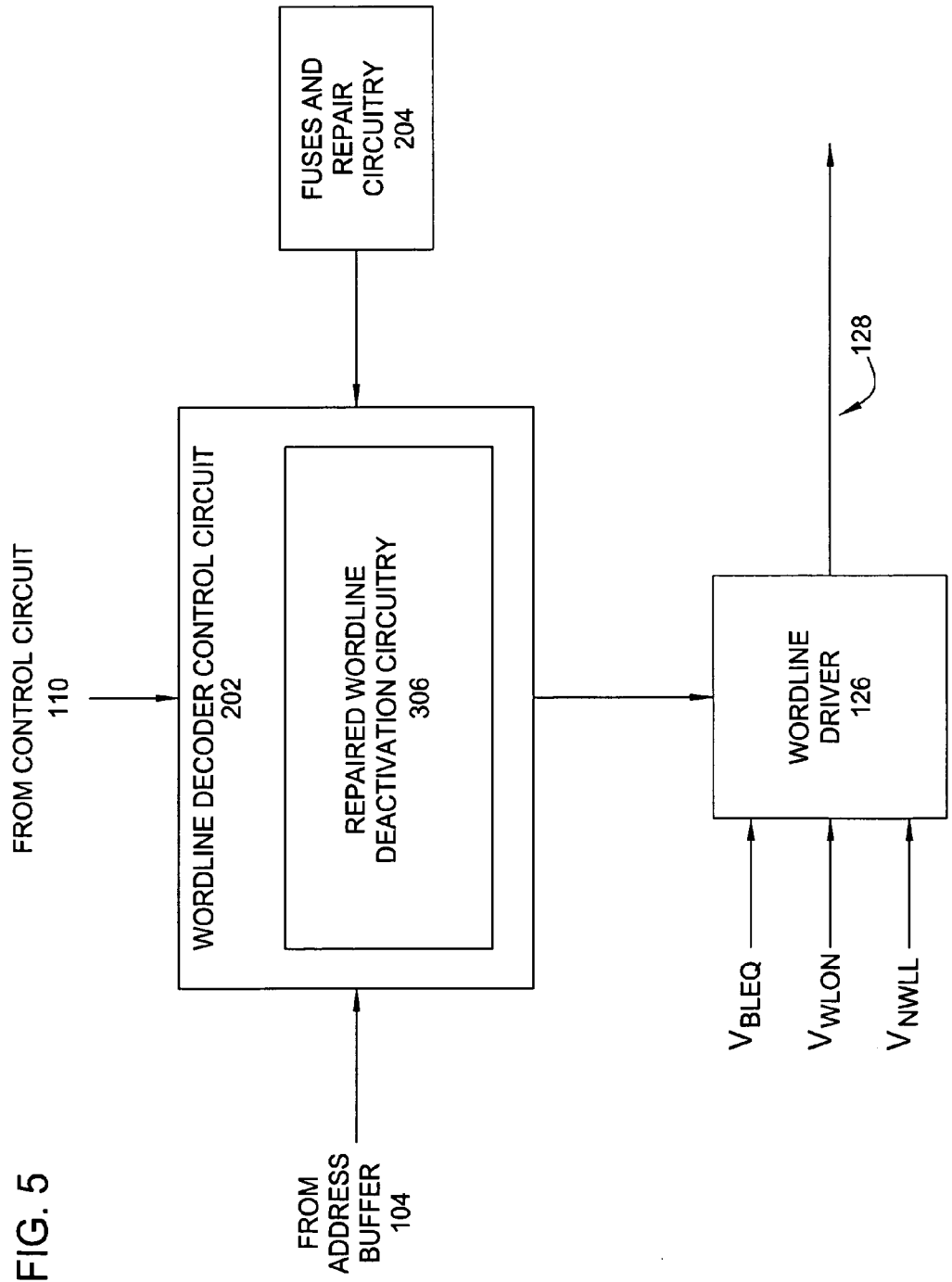
FIG. 5 is a block diagram depicting circuitry for applying a precharge voltage ($V_{BLEQ}$) to a repaired wordline according to one embodiment of the invention.

FIG. 5 is a block diagram depicting circuitry for applying a precharge voltage $V_{BLEQ}$ to a repaired wordline $128_1$ according to one embodiment of the invention. In one embodiment, the wordline drive 126 may receive a signal from the wordline decoder control circuit 202 during precharge. For example, the wordline decoder control circuit 202 may use the information recorded in the fuses and repair circuitry to determine whether a given wordline 128 located in the memory device 100 is a good wordline, a defective and/or repaired wordline, or a redundant wordline.

For example, if the control circuit 110 indicates that a precharge is being performed, the wordline decoder control circuit 202 may use the information provided by the fuses and repair circuitry 204 to determine which wordlines 128 are defective and repaired. If a wordline 128 is defective, the repaired wordline deactivation circuitry 306 may assert a signal to the wordline driver 126 indicating that the wordline voltage WL may be changed to the precharge voltage, $V_{BLEQ}$. If, however, the fuses and repair circuitry 204 does not indicate that a given wordline 128 is defective, the wordline decoder control circuit 202 may assert a signal to the wordline driver 126 indicating that the wordline voltage WL may be changed to the wordline off voltage, $V_{NWLL}$.

As described above, the wordline decoder control circuit 202 may also determine if an address being accessed during activation corresponds to a defective wordline. If the address being accessed does correspond to a defective wordline, the wordline decoder control circuit 202 may cause the wordline driver 126 to apply the wordline off voltage $V_{NWLL}$ voltage to the defective wordline while the wordline decoder control circuit 202 may cause another wordline driver 126 to apply the wordline on voltage $V_{WLON}$ to a redundant wordline (e.g., indicated by the fuses and repair circuitry 204), thereby accessing the redundant wordline instead of the defective wordline.

Figure 6A:
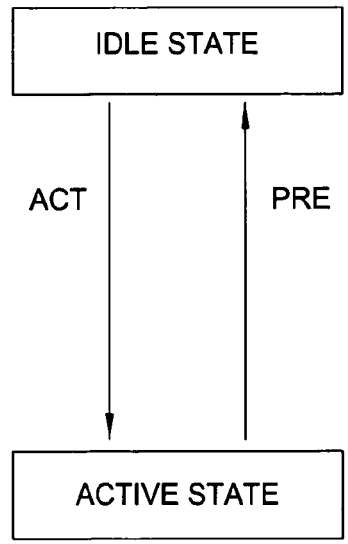
FIG. 6A is a state diagram depicting activate and precharge states for a memory device according to one embodiment of the invention.

As described above, in some cases, the memory device 100 may perform a series of activations of one or more wordlines followed by a series of precharges. FIG. 6A is a state diagram depicting activate and precharge states for a memory device according to one embodiment of the invention. When an activate command is received by the memory device 100, the memory device 100 may raise a signal (ACT) indicating that the activate command has been received and placing the memory device 100 in an activate state.

After the memory device 100 has been placed in the activate state, at some time later, a precharge command may be received, thereby causing a precharge signal (PRE) to be raised. Optionally, in some cases, the precharge command may be automatically issued (e.g., the PRE signal may be automatically raised) after the memory device 100 has been placed in the activate state (e.g., after the memory device 100 has been placed in the activate state for a given period of time). When the PRE signal is raised, the memory device may be placed into an idle state. Later, another activate command may place the memory device back in the activate state.

Figure 6B:
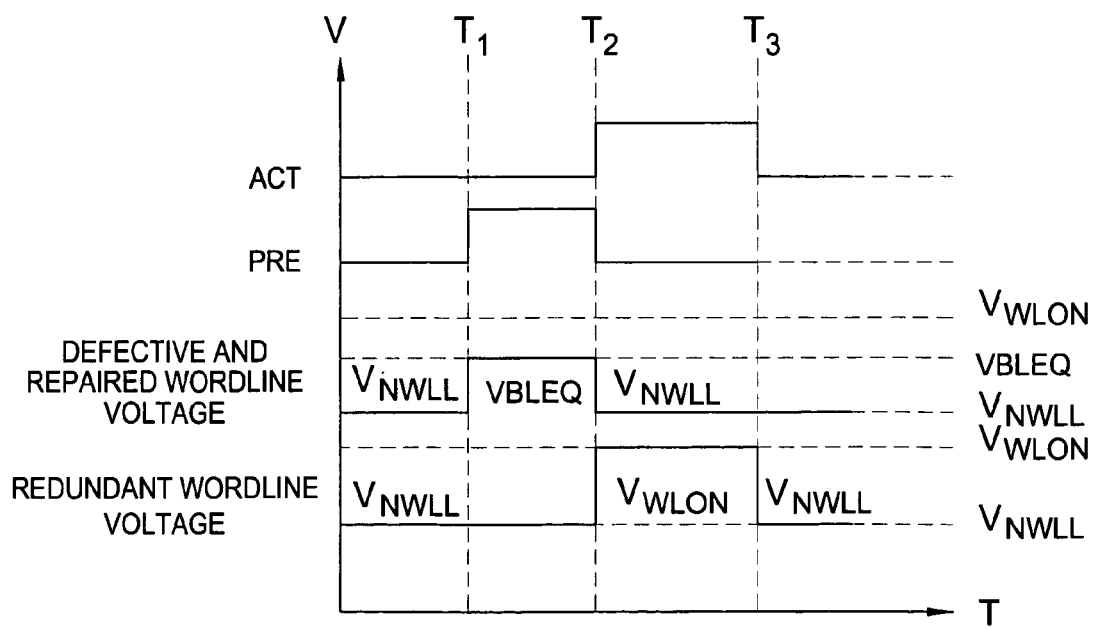
FIG. 6B is a timing diagram depicting activate and precharge cycles of wordlines in a memory device according to one embodiment of the invention.

FIG. 6B is a timing diagram depicting activate and precharge cycles of wordlines in a memory device according to one embodiment of the invention. As depicted, at time $T_1$, a PRE signal may be asserted, indicating that one or more memory banks 120 are to be precharged. When the PRE signal is asserted, the wordline voltage for a defective and repaired wordline voltage may be changed to the precharge voltage, $V_{BLEQ}$. Also, the wordline off voltage $V_{NWLL}$ may be applied to the redundant wordline used to replace the repaired wordline.

Later, from time $T_2$ to $T_3$, an ACT signal may be asserted, indicating that an address in the memory bank 120 is to be activated. When the ACT signal is received, the repaired wordline may be lowered to the wordline off voltage $V_{NWLL}$, thereby deactivating any access transistors controlled by the defective wordline and allowing another wordline to be activated. Also, if the address being accessed during activation corresponds to the defective wordline, the redundant wordline may be accessed instead by driving the redundant wordline to the wordline on voltage $V_{WLON}$, as depicted.

While embodiments are described above with respect to applying a precharge voltage $V_{BLEQ}$ to a repaired wordline, in some cases, a repaired wordline may be electrically isolated (e.g., floated) during a precharge. Thus, in such cases, a circuitry and wiring to connect the repaired wordline to $V_{BLEQ}$ may not be required. If the repaired wordline is electrically isolated during a precharge, no continuous current can flow between the repaired wordline and the bitline to which the repaired wordline is shorted. In one embodiment, one or more transistors may be used to electrically isolate the repaired wordline during the precharge. For example, a transistor may be placed between each wordline driver 126 and the power supply for $V_{NWLL}$. During precharge, the transistor for each repaired wordline may be closed, thereby electrically isolating the repaired wordline from $V_{NWLL}$. Optionally, one or more transistors may be placed between each wordline and wordline driver. During precharge, the one or more transistors connected to repaired wordlines may be closed, thereby electrically isolating the repaired wordlines. Optionally, each wordline driver may be modified, wherein a control signal issued to the wordline driver may be used to electrically isolate the wordline for the wordline driver. During precharge, the control signals issued to the wordline drivers for repaired wordlines may be used to electrically isolate the repaired wordlines.

In some cases, activate and precharge commands may be issued as separate commands to the memory device 100, e.g., using the command inputs and/or address inputs. In other cases, the activate and precharge commands may be automatically issued by the memory device 100, for instance, in response to another command received by the memory device 100 or in response to internal commands and/or circuitry of the memory device 100. For example, the activate and precharge commands may be issued as a result of another command issued to the memory device 100, such as a read command, write command, or refresh command.

In some cases, the refresh command may be an auto-refresh or CBR command. When an auto-refresh or CBR command is issued to the memory device, one or more memory banks 120 of the memory device 100 may be precharged. Also, an internal address register may be incremented. The memory address identified by the internal address register may be activated so that memory cells corresponding to the memory address may be refreshed. By issuing a group of auto-refresh or CBR commands to the memory device 100, with each command refreshing a new address in the memory device 100, the memory device 100 may be refreshed.

As another example of a refresh command, the refresh command may be a self-refresh command. When a self-refresh command is issued to the memory device, an internal address counter may be initialized and incremented. When the address counter is incremented, a different address identified by the address counter may be activated, thereby refreshing the identified address. In between activating each identified address, one or more memory banks 120 of the memory device may be precharged. The self-refresh command may automatically terminate after the entire memory device has been refreshed.

In one embodiment of the invention, a defective wordline may not be replaced with a redundant wordline, but address information identifying the defective wordline may be stored so that the defective wordline may be identified, thereby allowing the voltage of the defective wordline to be changed to the precharge voltage $V_{BLEQ}$ during precharge.

While described above with respect to storing address information in fuses, where the address information identifies the defective wordline and/or a redundant wordline, in other embodiments, the identification and replacement of a defective wordline $128_1$ with a redundant wordline $128_3$ may be accomplished in another way, for example, without fuses which identify the defective wordline. In general, any means may be used to determine which wordlines are defective and/or repaired wordlines and which wordlines are redundant wordlines.

As described above, the memory device may be tested to determine which wordlines, if any, are defective. In some cases, the testing may occur during a manufacturing phase of the memory device, for instance, before or after the memory device has been packaged. Optionally, the testing may occur after the memory device has been installed in another electronic device and is placed in use. In some cases, the testing may occur before, or optionally after, a stress test of the memory device (referred to as a burn-in).

In some cases, the testing may be performed by another device (e.g., a tester or a processor in communication with the memory device). Optionally, the memory device may perform the test itself, for example, using built-in self test circuitry (BIST circuitry) within the memory device. In some cases, the self test may be performed, for example, in response to a command received by the memory device or when a flag is set in a mode register of the memory device. Also, in some cases, the self-test may be performed each time the memory device is initialized, for example, after the memory device is powered on or after the memory device is reset.

While described above with respect to a single memory bank accessed by a wordline decoder and a column decoder, as recognized by those skilled in the art, embodiments of the invention may be adapted for use with any acceptable memory device having memory in any acceptable configuration. For example, in some cases, the defective wordline and redundant wordline may be located in a single block in a single memory bank. Optionally, the defective wordline and the redundant wordline may be located in different blocks and/or different memory banks.

While described above with respect to replacing one defective wordline with a redundant wordline, embodiments of the invention may be utilized where any number of defective wordlines are replaced with any number of other, redundant wordlines. In some cases, a group of wordlines containing one or more defective wordlines may be replaced by a group of redundant wordlines. For example, as mentioned above, in some cases, embodiments of the invention may be utilized with a segmented wordline architecture containing one or more main wordlines and a plurality of local wordlines each accessed by a main wordline. Where a segmented wordline architecture is used, in some cases, a segment containing a defective wordline may be replaced with another segment, for example, by storing address information for the segments as previously described.

In some cases, where a segmented wordline architecture is used, the voltage for each main wordline may be re-driven by local wordline drivers (also referred to as re-drivers). Where local wordline drivers are utilized, each local wordline driver may be capable of driving a defective local wordline indicated by the fuses and repair circuitry 204 to $V_{BLEQ}$ during a precharge, thereby reducing power consumption due to the defective local wordline.

While the foregoing is directed to embodiments of the present invention, other and further embodiments of the invention may be devised without departing from the basic scope thereof, and the scope thereof is determined by the claims that follow.

What is claimed is:

1. A method for reducing power consumption of a memory device, comprising:
   initiating a precharge operation, wherein the precharge operation comprises driving one or more bitlines to a precharge voltage;
   identifying one or more defective wordlines; and
   during the precharge operation, performing one of:
      driving the identified defective wordlines to the precharge voltage; and
      electrically isolating the identified defective wordlines.

2. The method of claim 1, further comprising:
   during the precharge operation, driving one or more wordlines to a wordline off voltage, wherein the one or more wordlines are redundant wordlines used to replace the one or more defective wordlines.

3. The method of claim 1, further comprising:
   after the precharge operation, initiating an activate operation for an address corresponding to one of the one or more defective wordlines, wherein the activate operation comprises driving the one or more defective wordlines to a wordline off voltage.

4. The method of claim 3, further comprising:
during the activate operation, driving a redundant wordline to a wordline on voltage, wherein the redundant word line is used to replace the one of the one or more defective wordlines.

5. The method of claim 1, further comprising:
after the precharge operation, initiating an activate operation for an address which does not correspond to a defective wordline, wherein the activate operation comprises driving the one or more defective wordlines to a wordline off voltage and driving a wordline corresponding to the address to a wordline on voltage.

6. The method of claim 1, wherein the one or more defective wordlines are stitched wordlines, wherein each stitched wordline comprises a polysilicon wordline electrically connected to a layer of metal by a plurality of electrical connections.

7. The method of claim 1, wherein the one or more defective wordlines are local wordlines in a segmented memory architecture, wherein one or more main wordlines are each used to access a plurality of local wordlines, respectively.

8. A memory device comprising:
one or more bitlines;
one or more defective wordlines; and
circuitry configured to:
initiate a precharge operation, wherein the precharge operation comprises driving the one or more bitlines to a precharge voltage;
identify one or more defective wordlines; and
during the precharge operation, perform one of:
drive the identified defective wordlines to the precharge voltage; and
electrically isolate the identified defective wordlines.

9. The memory device of claim 8, further comprising:
one or more redundant wordlines used to replace the one or more defective wordlines, and wherein the circuitry is further configured to, during the precharge operation, drive the one or more redundant wordlines to a wordline off voltage.

10. The memory device of claim 8, wherein the circuitry is further configured to:
after the precharge operation, initiate an activate operation for an address corresponding to one of the one or more defective wordlines, wherein the activate operation comprises driving the one or more defective wordlines to a wordline off voltage.

11. The memory device of claim 10, further comprising:
a redundant wordline used to replace the one of the one or more defective wordlines, and wherein the circuitry is further configured to, during the activate operation, drive the redundant wordline to a wordline on voltage.

12. The memory device of claim 8, wherein the circuitry is further configured to:
after the precharge operation, initiate an activate operation for an address which does not correspond to a defective wordline, wherein the activate operation comprises driving the one or more defective wordlines to a wordline off voltage and driving a wordline corresponding to the address to a wordline on voltage.

13. The memory device of claim 8, wherein the one or more defective wordlines are stitched wordlines, wherein each stitched wordline comprises a polysilicon wordline electrically connected to a layer of metal by a plurality of electrical connections.

14. The memory device of claim 8, wherein the one or more defective wordlines are local wordlines in a segmented memory architecture and wherein the memory device further comprises one or more main wordlines each used to access a plurality of local wordlines, respectively.

15. A memory device comprising:
one or more bitlines;
one or more defective wordlines; and
means for controlling configured to:
initiate a precharge operation, wherein the precharge operation comprises driving the one or more bitlines to a precharge voltage;
identify one or more defective wordlines; and
during the precharge operation, perform one of:
drive the identified defective wordlines to the precharge voltage; and
electrically isolated the identified defective wordlines.

16. The memory device of claim 15, further comprising:
one or more redundant wordlines used to replace the one or more defective wordlines, and wherein the means for controlling is further configured to, during the precharge operation, drive the one or more redundant wordlines to a wordline off voltage.

17. The memory device of claim 15, wherein the means for controlling is further configured to:
after the precharge operation, initiate an activate operation for an address corresponding to one of the one or more defective wordlines, wherein the activate operation comprises driving the one or more defective wordlines to a wordline off voltage.

18. The memory device of claim 17, further comprising:
a redundant wordline used to replace the one of the one or more defective wordlines, and wherein the means for controlling is further configured to, during the activate operation, drive the redundant wordline to a wordline on voltage.

19. The memory device of claim 15, wherein the means for controlling is further configured to:
after the precharge operation, initiate an activate operation for an address which does not correspond to a defective wordline, wherein the activate operation comprises driving the one or more defective wordlines to a wordline off voltage and driving a wordline corresponding to the address to a wordline on voltage.

20. The memory device of claim 15, wherein the one or more defective wordlines are stitched wordlines, wherein each stitched wordline comprises a polysilicon wordline electrically connected to a layer of metal by a plurality of electrical connections.

21. The memory device of claim 15, wherein the one or more defective wordlines are local wordlines in a segmented memory architecture and wherein the memory device further comprises one or more main wordlines each used to access a plurality of local wordlines, respectively.

22. A method for reducing power consumption of a memory device, comprising:
detecting one or more defective wordlines in the memory device;
storing address information identifying each of the one or more defective wordlines,
initiating a precharge operation, wherein the precharge operation comprises driving one or more bitlines to a precharge voltage; and
during the precharge operation, identifying the one or more defective wordlines using the stored address information and performing one of:
driving the identified one or more defective wordlines to the precharge voltage; and electrically isolating the identified one or more defective wordlines from a wordline off voltage.

23. The method of claim 22, further comprising:
in response to detecting the one or more defective wordlines, replacing the one or more defective wordlines with one or more redundant wordlines; and
during the precharge operation, applying the wordline off voltage to the redundant wordline.

24. The method of claim 22, further comprising:
activating an address of the memory device, wherein activating the address comprises:
identifying the one or more defective wordlines using the stored address information;
driving the identified one or more defective wordlines to the wordline off voltage;
determining if the activated address matches an address in the stored address information; and
if so, applying a wordline on voltage to a redundant wordline corresponding the address in the stored address information.

25. The method of claim 22, wherein the one or more defective wordlines are shorted to at least one of the one or more bitlines.

26. A memory device comprising:
a plurality of normal wordlines;
one or more redundant wordlines used to replace one or more defective normal wordlines;
repair circuitry configured to store information identifying the one or more defective normal wordlines and the one or more redundant wordlines used to replace the one or more defective normal wordlines;
precharge circuitry configured to initiate a precharge operation;
bitline control circuitry configured to drive one or more bitlines to a precharge voltage during the precharge operation;
repaired wordline deactivation circuitry configured to identify the one or more defective wordlines using the stored information and, during the precharge operation, drive the identified one or more defective wordlines to the precharge voltage.

27. The memory device of claim 26, further comprising:
activation circuitry configured to:
activate an address of the memory device, wherein activating the address comprises:
identifying the one or more defective wordlines using the stored address information;
driving the identified one or more defective wordlines to the wordline off voltage;
determining if the activated address matches an address in the stored address information; and
if so, applying a wordline on voltage to a redundant wordline corresponding the address in the stored address information.

28. The memory device of claim 26, wherein wordlines in the memory device are stitched wordlines, wherein each stitched wordline comprises a polysilicon wordline electrically connected to a layer of metal by a plurality of electrical connections.

29. The memory device of claim 26, wherein wordlines in the memory device are local wordlines in a segmented memory architecture and wherein the memory device further comprises one or more main wordlines each used to access a plurality of local wordlines, respectively.

30. A method for reducing power consumption of a memory device, comprising:
detecting one or more defective wordlines in the memory device;
storing address information identifying each of the one or more defective wordlines,
initiating a precharge operation, wherein the precharge operation comprises driving one or more bitlines to a precharge voltage; and
during the precharge operation, identifying the one or more defective wordlines using the stored address information and electrically isolating the identified one or more defective wordlines.

31. The method of claim 30, further comprising:
in response to detecting the one or more defective wordlines, replacing the one or more defective wordlines with one or more redundant wordlines; and
during the precharge operation, applying a wordline off voltage to the redundant wordline.

32. The method of claim 30, wherein electrically isolating the identified one or more defective wordlines comprises switching off a transistor located between the identified one or more defective wordlines and a power supply which supplies a wordline off voltage.

* * * * *